(12) United States Patent
    Deak

(10) Patent No.: US 10,024,930 B2
(45) Date of Patent: Jul. 17, 2018

(54) SINGLE CHIP REFERENCED BRIDGE MAGNETIC SENSOR FOR HIGH-INTENSITY MAGNETIC FIELD

(71) Applicant: MultiDimension Technology Co., Ltd., Zhangjiagang (CN)

(72) Inventor: James Geza Deak, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 170 days.

(21) Appl. No.: 15/108,162

(22) PCT Filed: Dec. 24, 2014

(86) PCT No.: PCT/CN2014/094838
    § 371 (c)(1),
    (2) Date: Jun. 24, 2016

(87) PCT Pub. No.: WO2015/096744
    PCT Pub. Date: Jul. 2, 2015

(65) Prior Publication Data
    US 2016/0327616 A1    Nov. 10, 2016

(30) Foreign Application Priority Data

Dec. 24, 2013 (CN) .......................... 2013 1 0719255

(51) Int. Cl.
    *G01R 33/09*    (2006.01)
(52) U.S. Cl.
    CPC .................................... *G01R 33/09* (2013.01)
(58) Field of Classification Search
    None
    See application file for complete search history.

(56) References Cited

U.S. PATENT DOCUMENTS

| 5,217,010 A | 6/1993 | Tsitlik et al. |
| 2009/0102464 A1* | 4/2009 | Doogue ................ B82Y 25/00 324/207.21 |

FOREIGN PATENT DOCUMENTS

| CN | 101587174 | 11/2009 |
| CN | 102323554 | 1/2012 |

(Continued)

OTHER PUBLICATIONS

"International Application No. PCT/CN2014/094838, International Search Report and Written Opinion dated Mar. 13, 2015", (dated Mar. 13, 2015), 12 pgs.

*Primary Examiner* — Daniel Miller
*Assistant Examiner* — Nasima Monsur
(74) *Attorney, Agent, or Firm* — Schwegman Lundberg & Woessner, P.A.

(57) ABSTRACT

A single chip referenced bridge type magnetic field sensor for high-intensity magnetic field, the sensor comprises a substrate, a reference arm, a sense arm, shielding structures and attenuators. Wherein the reference arms and the sense arms comprise at least two rows/columns of reference element strings and sense element strings which comprise one or more identical electrically interconnected magnetoresistive sense elements; the reference element strings and the sense element strings are mutually interleaved, each reference element string is designed with a shielding structure on top of it, and each sense element string is designed with an attenuator on top of it. The magnetoresistive sensor elements can be AMR, GMR or TMR sensor elements. The shielding structures and attenuators are arrays of long rectangular bars composed of a soft ferromagnetic material, such as permalloy. The sensor may be implemented in three different bridge structures, a quasi-bridge, a referenced half-bridge, and a referenced full-bridge. This sensor has several advantages (Continued)

including low power consumption, excellent linearity, and wide working range making it able to operate in high-intensity magnetic fields.

16 Claims, 5 Drawing Sheets

(56)  References Cited

FOREIGN PATENT DOCUMENTS

| | | |
|---|---|---|
| CN | 103267955 | 8/2013 |
| CN | 203337808 | 12/2013 |
| CN | 103592608 | 2/2014 |
| CN | 103645449 | 3/2014 |
| CN | 203587786 | 5/2014 |
| CN | 203658561 | 6/2014 |
| JP | 2013053903 | 3/2013 |
| WO | WO-2015096744 | 7/2015 |

* cited by examiner

SINGLE CHIP REFERENCED BRIDGE MAGNETIC SENSOR FOR HIGH-INTENSITY MAGNETIC FIELD

PRIORITY CLAIM TO RELATED APPLICATIONS

This application is a U.S. national stage application filed under 35 U.S.C. § 371 from International Application Serial No. PCT/CN2014/094838, which was filed 24 Dec. 2014, and published as WO2015/096744 on 2 Jul. 2015, and which claims priority to Chinese Application No. 201310719255.9, filed 24 Dec. 2013, which applications and publication are incorporated by reference as if reproduced herein and made a part hereof in their entirety, and the benefit of priority of each of which is claimed herein.

FIELD OF THE INVENTION

The present invention relates to the technical field of magnetic field sensors, in particular to a single chip referenced bridge type magnetic field sensor for high-intensity magnetic field.

BACKGROUND OF THE INVENTION

Magnetic field sensors are widely applied to modern industrial and electronic products to sense magnetic field intensity in order to measure physical parameters such as current, position, and direction. In the prior art, there are many different types of sensors which are used for measuring magnetic fields and other parameters, such as magnetic field sensors using Hall elements, Anisotropic Magneto resistance (AMR) elements or Giant Magneto resistance (GMR) elements as sense elements. Although Hall magnetic field sensors can work in high-intensity magnetic fields, they have the disadvantages of very low sensitivity, high power consumption, and the like. Although AMR magnetic field sensors are more sensitive than the Hall sensors, the AMR magnetic field sensors have a complex in manufacturing process, high power consumption, and are not applicable to high-intensity magnetic fields. Although GMR magnetic field sensors have higher sensitivity than the Hall magnetic field sensors, the GMR magnetic field sensors have low linearity range and are not applicable to high-intensity magnetic fields, either.

TMR (Tunneling Magneto Resistance) magnetic field sensors are new magnetoresistance effect sensors which have begun to be industrially applied in recent years, utilizing a tunneling magnetoresistance effect of a magnetic multilayer film material to sense magnetic fields, and they have higher sensitivity, and lower power consumption, than the Hall magnetic field sensors, the AMR magnetic field sensors and the GMR magnetic field sensors. However, the existing TMR magnetic field sensors are still not applicable to high-intensity magnetic fields and the linear range is not wide enough.

SUMMARY OF THE INVENTION

The purpose of the present invention is to overcome the above-mentioned problems existing in the prior art and provide a single chip referenced bridge type magnetic field sensor suitable for a high-intensity magnetic field.

In order to realize the above-mentioned technical purpose and achieve the above-mentioned technical effect, the present invention is implemented by adopting the following technical solution.

The present invention provides a single chip referenced bridge type magnetic field sensor for a high-intensity magnetic field, the sensor comprising:

a substrate;

at least one reference arm deposited on the substrate, the reference arm comprising at least one row/column of reference element strings which comprise one or at least two identical electrically interconnected magnetoresistive sense elements;

at least one sense arm deposited on the substrate, the sense arm comprising at least one row/column of sense element strings which comprise one or at least two identical electrically interconnected magnetoresistive sense elements;

at least one attenuator and at least two shielding structures, the attenuator and the shielding structures being mutually interleaved in a spaced manner, shapes of the attenuator and the shielding structures being the same, and width and area of the shielding structures being respectively greater than width and area of the attenuator;

wherein the reference arm and the sense arm are connected to form a bridge;

each reference element string is designed with a shielding structure on top of it, each sense element string is designed with an attenuator on top of it, the reference element strings are located below or above the shielding structures and the sense element strings are located below or above the attenuators;

the reference element strings and the sense element strings are the same in number of rows/columns and are mutually interleaved in a spaced manner along a longitudinal or transverse direction;

a gain coefficient of a magnetic field at the position of the sense element strings is greater than a gain coefficient of a magnetic field at the position of the reference element strings.

Preferably, the magnetoresistive sense elements forming the reference element strings and the sense element strings can be AMR, GMR or TMR sensor elements.

Preferably, the magnetoresistive sense elements can be in a GMR spin valve structure, a GMR multilayer film structure, a TMR spin valve structure or a TMR three-layer film structure.

Preferably, the bridge is a half-bridge, a full-bridge or a quasi-bridge.

Preferably, the magnetoresistive sense elements on the sense arm and the magnetoresistive sense elements on the reference arm are the same in number.

Preferably, each sense element string and an adjacent reference element string are spaced apart at a spacing L, when the number of the attenuators is odd, two reference element strings are adjacent in the middle and have a spacing 2 L therebetween, and when the number of the attenuators is even, two sense element strings are adjacent in the middle and have a spacing 2 L therebetween.

Preferably, the number N of the attenuators is not smaller than the number of rows/columns of the sense element strings, the number M of the shielding structures is not smaller than the number of rows/columns of the reference element strings, and N<M, wherein N and M are positive integers.

Preferably, the substrate comprises an integrated circuit or is connected with other substrates comprising an integrated circuit.

Preferably, the integrated circuit is one of CMOS, BiCMOS, Bipolar, BCDMOS and SOI, and the reference arm and the sense arm are directly deposited on top of the integrated circuit of the substrate.

Preferably, the substrate is an ASIC chip, and the ASIC chip comprises any one or at least two of an offset circuit, a gain circuit, a calibration circuit, a temperature compensation circuit and a logic circuit.

Preferably, the logic circuit is a digital switching circuit or a rotation angle calculating circuit.

Preferably, the shapes of the shielding structures and the attenuators are arrays of long bars which extend along a transverse/longitudinal direction.

Preferably, the shielding structures and the attenuators are composed of an identical material which is soft ferromagnetic alloy, and the soft ferromagnetic alloy contains one or at least two elements of Ni, Fe and Co.

Preferably, an input/output connecting terminal of the single chip referenced bridge type magnetic field sensor is electrically connected to an input/output connecting terminal of a semiconductor package, and a method of the semiconductor package comprises pad wire bonding, flip chip, ball grid array package, wafer level package or chip-on-board package.

Preferably, a working magnetic field intensity of the single chip referenced bridge type magnetic field sensor is 20-500 gausses.

Preferably, the shielding structures fully cover the reference element strings.

Compared with the prior art, the present invention has the following beneficial effects: low power consumption, good linearity, wide working range and applicability to high-intensity magnetic fields.

DESCRIPTION OF THE DRAWINGS

In order to more clearly illustrate the technical solution in the embodiments of the present invention, the drawings which need to be used in the description of the embodiments will be simply introduced below. Obviously, the drawings described below are just some embodiments of the present invention. For one skilled in the art, other drawings can be obtained according to these drawings without contributing any inventive labor.

DETAILED DESCRIPTION OF THE EMBODIMENTS

The present invention will be further described below in conjunction with the drawings and the embodiments.

Figure 1:
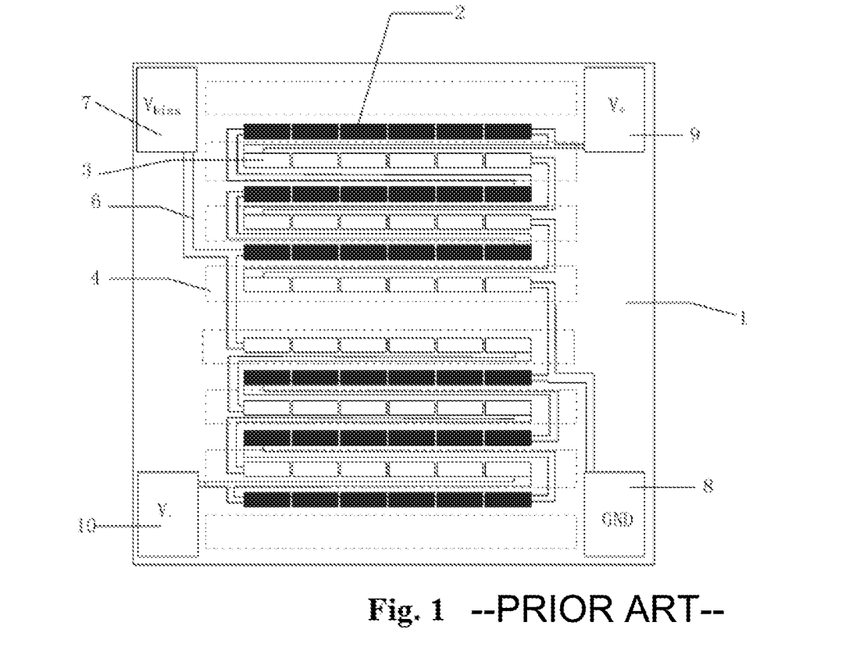
FIG. 1 is a structural schematic diagram of a single chip bridge type magnetic field sensor in the prior art.

FIG. 1 is a structural schematic diagram of a single chip bridge type magnetic field sensor disclosed by patent application 201310203311.3 in the prior art. The sensor comprises a substrate 1, sense element strings 2, reference element strings 3, shielding structures 4, electrical connecting conductors 6, and four pads 7-10 used for input/output connection and respectively used as a power supply terminal Vbias, a ground terminal GND and voltage outputs V+ and V−, wherein the sense element strings 2 and the reference element strings 3 are mutually interleaved, the sense element strings 2 are located at a gap between two shielding structures 4 and the reference element strings 3 are located below the shielding structures 4. A sense arm, a reference arm and pads 7-10 are connected by using the electrical connecting conductors 6. The sensor has the advantages of high sensitivity, good linearity, small offset and the like, but it is easily saturated, thus is applicable to magnetic fields with maximum magnetic field intensity of about 100 gausses and cannot be used for higher-intensity magnetic fields.

Embodiments

Figure 2:
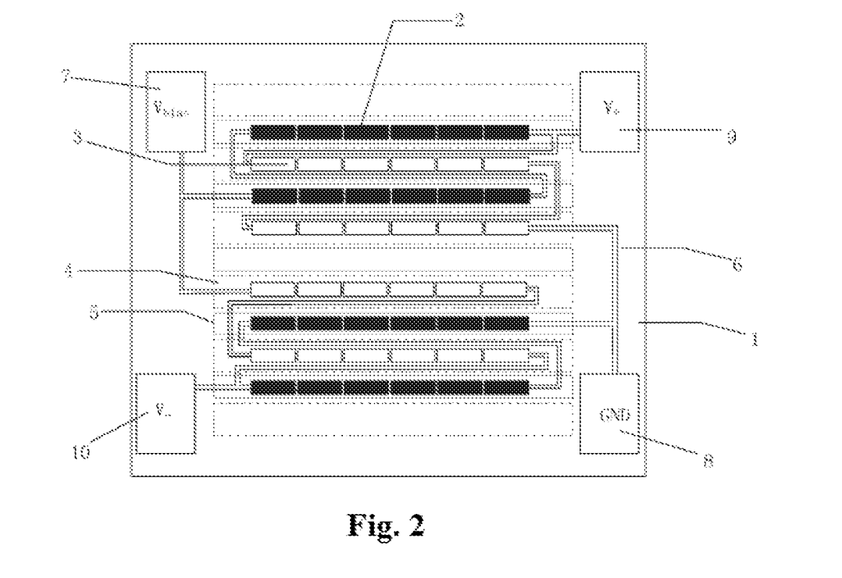
FIG. 2 is a structural schematic diagram of a single chip referenced bridge type magnetic field sensor provided by the present invention.
Figure 3:
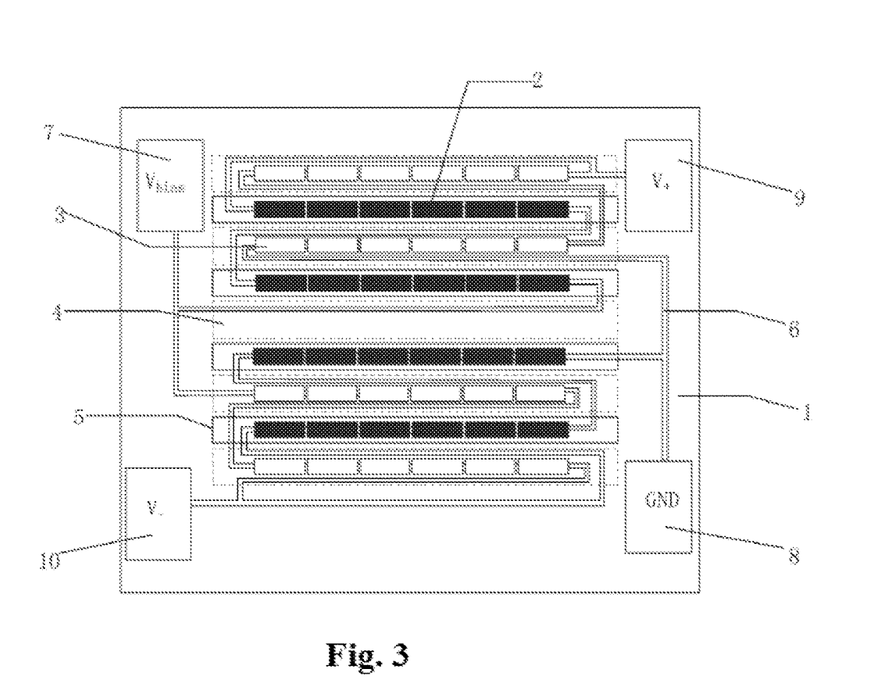
FIG. 3 is another structural schematic diagram of a single chip referenced bridge type magnetic field sensor provided by the present invention.

FIG. 2 is a structural schematic diagram of a single chip referenced bridge type magnetic field sensor provided by the present invention. The sensor in FIG. 2 differs from the sensor illustrated in FIG. 1 in that: the sensor further comprises attenuators 5, the attenuators 5 and the shielding structures 4 are arranged in a spaced manner, and the number N of the attenuators 5 is not smaller than the number of rows/columns of the sense element strings 2, the number M of the shielding structures 4 is not smaller than the number of rows/columns of the reference element strings 3, wherein N<M, N and M are positive integers. In FIG. 2, N is 5 and M is 6. The shapes of the attenuators 5 and the shielding structures 4 are the same and are preferably arrays of long bars which extend along a transverse/longitudinal direction, and they are composed of an identical material which is soft ferromagnetic alloy consisting of one or several elements of Ni, Fe and Co and can also be a non-ferromagnetic material but is not limited to the above-mentioned materials. The sense element strings 2 and the reference element strings 3 respectively consist of at least one row/column comprising one or at least two identical electrically interconnected magnetoresistive sense elements, preferably, the magnetoresistive sense elements are AMR, GMR or TMR sensor elements, the magnetoresistive sense elements included by the sense element strings 2 and the magnetoresistive sense elements included by the reference element strings 3 are the same in number, and pinning layers thereof are also the same in magnetization direction. The sense element strings 2 and the reference element strings 3 are mutually interleaved, each sense element string 2 and an adjacent reference element string 3 are spaced apart at a spacing L, however, for an odd number of the attenuators 5 as illustrated in FIG. 2, two reference element strings 3 are adjacent in the middle and have a spacing 2 L therebetween, and for an even number of the attenuators 5 as illustrated in FIG. 3, two sense element strings 2 are adjacent in the middle and have a spacing 2 L therebetween. The spacing L is very small and is preferably 20-100 microns. Each sense element string 2 is designed with the attenuator 5 on top of it, each reference element string 3 is designed with the shielding structure 4 on top of it, the sense element strings 2 and the reference element strings 3 can be respectively placed above or below the attenuators 5 and the shielding structures 4, and FIG. 2 illustrates a situation of being placed below. Width and area of the shielding structures 4 are greater than width and area of the attenuators 5 and are greater enough to fully cover the reference element strings 3 such that a magnetic field at the position of the reference element strings 3 can be attenuated to a very great extent and even be fully shielded, while the magnetic field which can be sensed by the sense element strings 2 is attenuated under the effect of the attenuators 5 but the attenuation amplitude is not very great, such that a gain coefficient Asns of the magnetic field at the position of the sense element strings 2 is greater than a gain coefficient Aref of the magnetic field at the position of the reference element strings 3. A sense arm formed by interconnected sense element strings 2 and a reference arm formed by interconnected reference element strings 3 are electrically connected to form a bridge, and input/output connecting terminals of the bridge are respectively a power supply terminal Vbias 7, a ground terminal GND 8 and voltage outputs V+ 9 and V− 10. All elements on the sensor are connected through electrical connecting conductors 6.

The substrate 1 may also have an integrated circuit printed thereon or is connected with another substrate printed with an integrated circuit, preferably, the printed integrated circuit can be CMOS, BiCMOS (bipolar complementary metal oxide semiconductor), Bipolar, BCDMOS (bipolar-CMOS-DMOS structure) or SOI (Silicon-On-Insulator), and the reference arm and the sense arm are directly deposited on top of the integrated circuit of the substrate 1. In addition, the substrate 1 can also be an Application-Specific Integrated Circuit (ASIC) chip comprising any one or several of an offset circuit, a gain circuit, a calibration circuit, a temperature compensation circuit and a logic circuit, wherein the logic circuit can be a digital switching circuit or a rotation angle calculating circuit but is not limited to the above-mentioned circuits.

In this embodiment, pads are used for input/output connection, and semiconductor package methods such as flip chip, ball grid array package, wafer level package and chip-on-board package and the like can also be adopted. The sensor is applicable to magnetic fields of 20-500 gausses.

Figure 4:
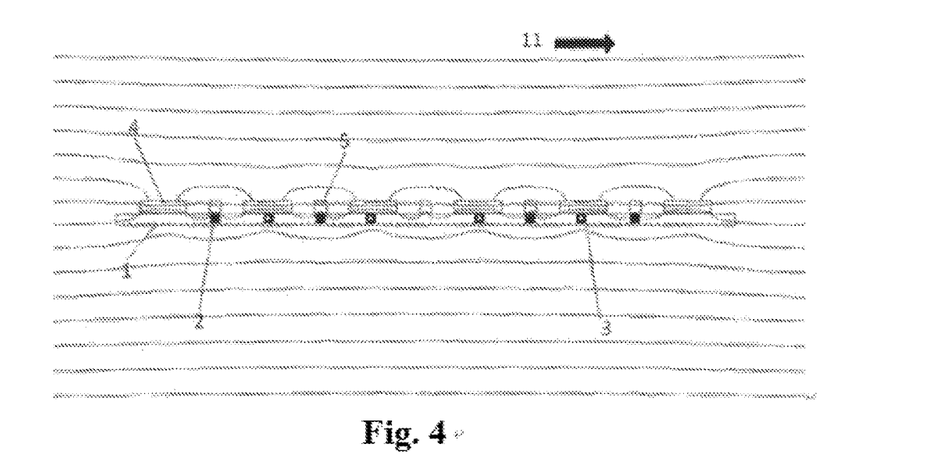
FIG. 4 is a magnetic field distribution diagram of a single chip referenced bridge type magnetic field sensor in an external magnetic field in the present invention.
Figure 5:
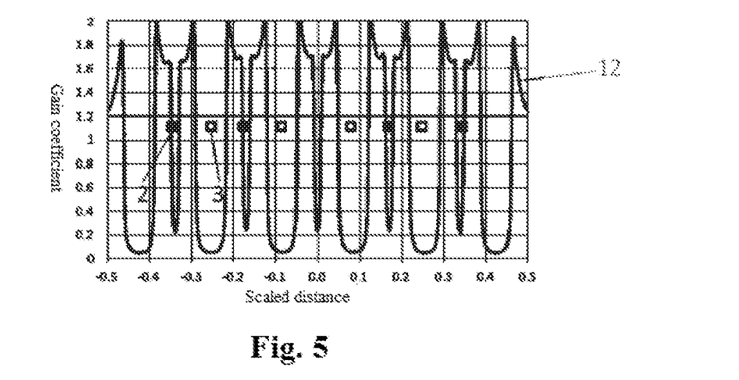
FIG. 5 is a relation curve between positions of reference element strings and sense element strings and corresponding gain coefficients in the present invention.

FIG. 4 is a magnetic field distribution diagram of the sense element strings 2 and the reference element strings 3 in an externally applied magnetic field in the present invention. In the figure, a direction of the externally applied magnetic field is 11. The magnetoresistive sense elements forming the sense element strings 2 and the reference element strings 3 are TMR sensor elements. From the figure, it can be seen that the magnetic field at the position of the reference element strings 3 is greatly attenuated under the effect of the shielding structures, while the attenuation amplitude of the magnetic field at the position of the sense element strings 2 is smaller than that of the former. FIG. 5 is a relation curve between positions of corresponding sense element strings 2 and reference element strings 3 in FIG. 4 and gain coefficients at corresponding positions. In the figure, positions expressed by a horizontal axis are reflected in the form of scaled distance. From FIG. 5, it can be seen that the gain coefficient Asns of the magnetic field amplitude at the position of the sense element strings 2 and the gain coefficient Aref of the magnetic field amplitude at the position of the reference element strings 3 are between 0 and 1, wherein the gain coefficient Asns is greater than the gain coefficient Aref. In other words, the attenuation amplitude of the magnetic field at the position of the reference element strings 3 is greater than the attenuation amplitude of the magnetic field at the position of the sense element strings 2, and this is consistent with a conclusion obtained from FIG. 4.

Figure 6:
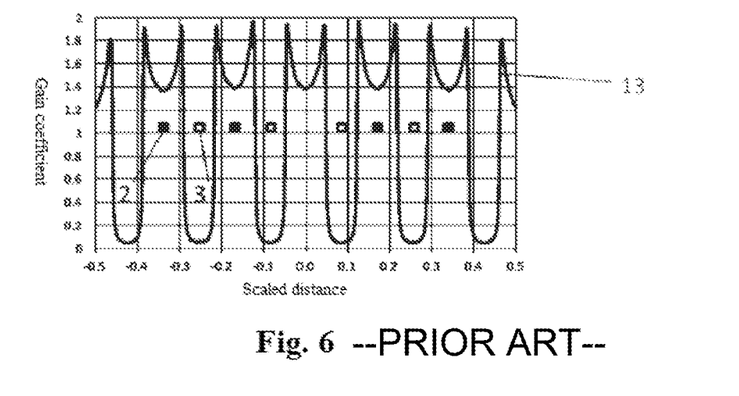
FIG. 6 is a relation curve between positions of reference element strings and sense element strings and corresponding gain coefficients in the prior art.

FIG. 6 is a relation curve between positions of sense element strings 2 and reference element strings 3 of a corresponding sensor structure in FIG. 1 and gain coefficients at corresponding positions. In order to facilitate comparison, the numbers of the reference element strings 3 and the sense element strings 2 are the same as the numbers of those in FIG. 5. By comparing two curves 12 and 13 in FIG. 5 and FIG. 6, it can be found that the magnetic field amplitude at the position of the sense element strings 2 in the present invention is greatly attenuated, such that even though the single chip referenced bridge type magnetic field sensor in the present invention is placed in a high-intensity magnetic field, the magnetic field sensed by the sensor is the attenuated magnetic field and the sensor can still work normally as long as it is within the saturated range thereof.

Figure 7:
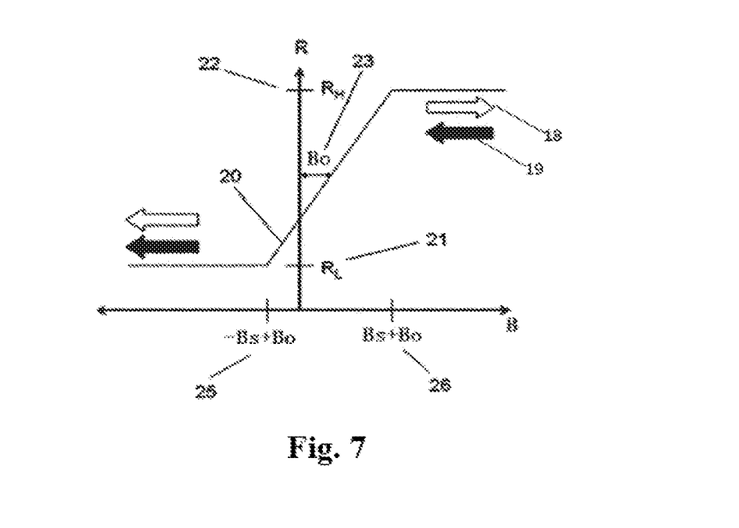
FIG. 7 is a response curve of magnetoresistive sense elements in TMR and GMR spin valve structures.

FIG. 7 is a response curve of magnetoresistive sense elements in TMR and GMR spin valve structures. When the direction of the externally applied magnetic field 11 is in parallel with a magnetization direction 19 of the pinning layers and the intensity of the externally applied magnetic field is greater than −Bs+Bo 25, a magnetization direction 18 of a magnetic free layer is in parallel with the direction of the externally applied magnetic field 11 and is further in parallel with the magnetization direction 19 of the pinning layers, and at this moment the magnetoresistance of the TMR elements is the smallest, i.e., $R_L$ 21. When the direction of the externally applied magnetic field 11 is in anti-parallel with the magnetization direction 19 of the pinning layers and the intensity of the externally applied magnetic field is greater than Bs+Bo 26, the magnetization direction 18 of the magnetic free layer is in parallel with the direction of the externally applied magnetic field 11 and is further in anti-parallel with the magnetization direction 19 of the pinning layers, and at this moment the magnetoresistance of the TMR elements is the largest, i.e., $R_H$ 22. When the intensity of the externally applied magnetic field 11 is Bo 23, the magnetization direction 18 of the magnetic free layer is perpendicular to the magnetization direction 19 of the pinning layers, and at this moment the magnetoresistance of the TMR elements is a median value of $R_L$ 21 and $R_H$ 22, i.e., $(R_L+R_H)/2$. Magnetic fields between −Bs+Bo 25 and Bs+Bo 26 are a measurement range of the single chip linear bridge type magnetic field sensor. From the figure, it can be seen that curve 20 is linear between −Bs+Bo 25 and Bs+Bo 26, a resistance change rate is $$\frac{R_H - R_L}{R_L} \times 100\% = \frac{\Delta R}{R_L} \times 100\%.$$

For a TMR spin valve, its resistance change rate can be up to 200%, while for a GMR spin valve, its resistance change rate is only up to 10%.

Figure 8:
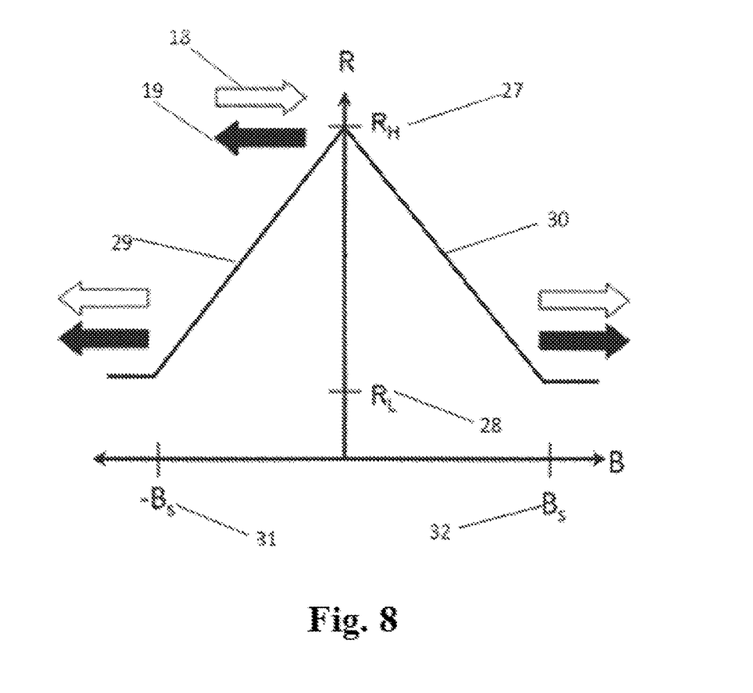
FIG. 8 is a response curve of magnetoresistive sense elements in a TMR three-layer film structure and a GMR multilayer film structure.

FIG. 8 is a response curve of magnetoresistive sense elements in a TMR three-layer film structure and a GMR multilayer film structure. When the direction of the externally applied magnetic field 11 is in parallel with the magnetization direction 19 of the pinning layers and the intensity of the externally applied magnetic field is greater than −Bs 31 or Bs 32, the magnetization direction 18 of the magnetic free layer is in parallel with the direction of the externally applied magnetic field 11 and is further in parallel with the magnetization direction 19 of the pinning layers, and at this moment the magnetoresistance of the MTJ elements is the smallest, i.e., $R_L$ 28. When the externally applied magnetic field is 0, the magnetization direction 18 of the magnetic free layer is in anti-parallel with the magnetization direction 19 of the pinning layers, and at this moment the magnetoresistance of the MTJ elements is the largest, i.e., $R_H$ 27. Magnetic fields between −Bs 31 and Bs 32 are a measurement range of the sensor. From the figure, it can be seen that curves 29 and 30 are linear between −Bs 31 and Bs 32 and the resistance change rate of the magnetoresistive elements can also be up to 200%.

Figure 9:
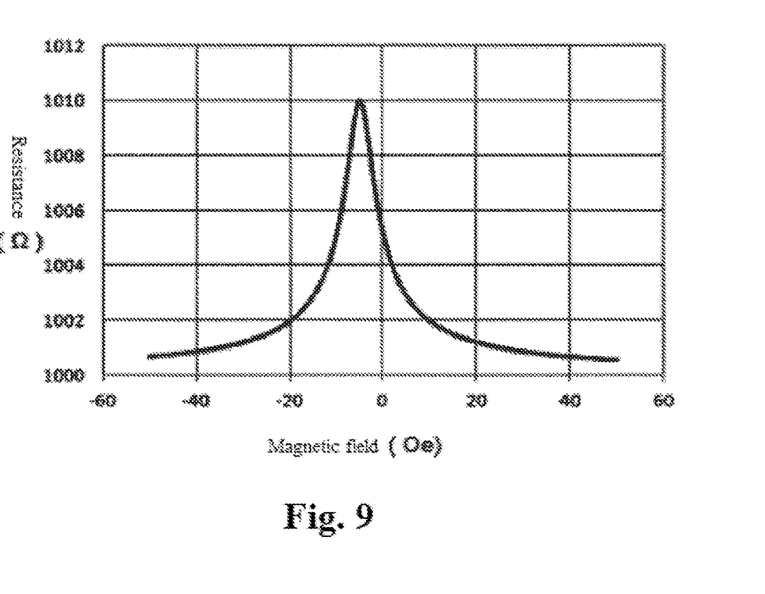
FIG. 9 is a response curve of magnetoresistive sense elements in an AMR barber-pole structure.

FIG. 9 is a response curve of magnetoresistive sense elements in an AMR Barber-pole structure. From the figure, it can be seen that the resistance change rate of the magnetoresistive elements is approximately 1%.

Figure 10:
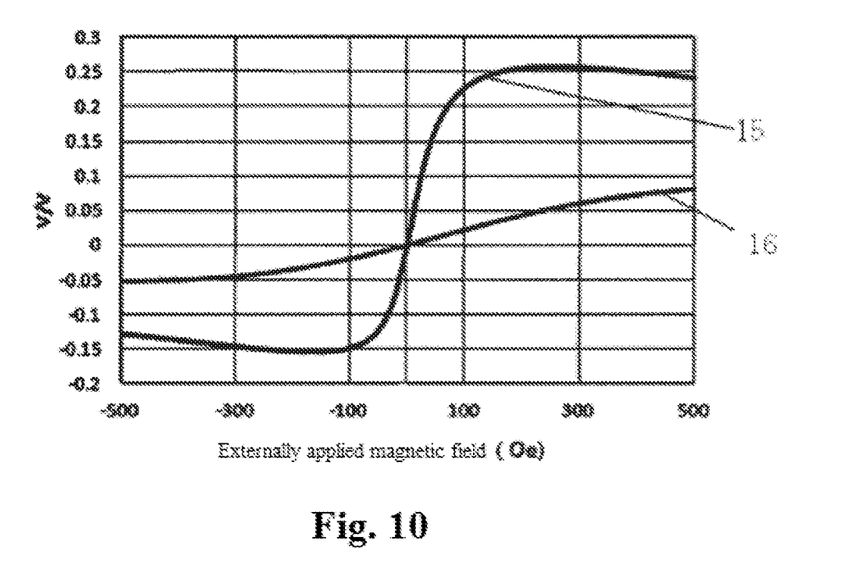
FIG. 10 is a transfer curve of a magnetic field sensor in a TMR spin valve structure with and without an attenuator in the present invention.

FIG. 10 is a conversion characteristic curve of a single chip referenced bridge type sensor with magnetoresistive sense elements in a TMR spin valve structure with and without an attenuator. Curve 15 represents a situation that the attenuator does not exist, and curve 16 represents a situation that the attenuator is used, a horizontal axis expresses a magnitude of an externally applied magnetic field, and a longitudinal axis expresses a ratio of sensor output voltage to power supply voltage. By comparing the two curves, it can be seen that the magnetic field linearity range corresponding to curve 15 is about 35 Oe, while the magnetic field linearity range corresponding to curve 16 is about 150 Oe, and accordingly the linear working range of the sensor obviously becomes wider after using the attenuator.

Figure 11:
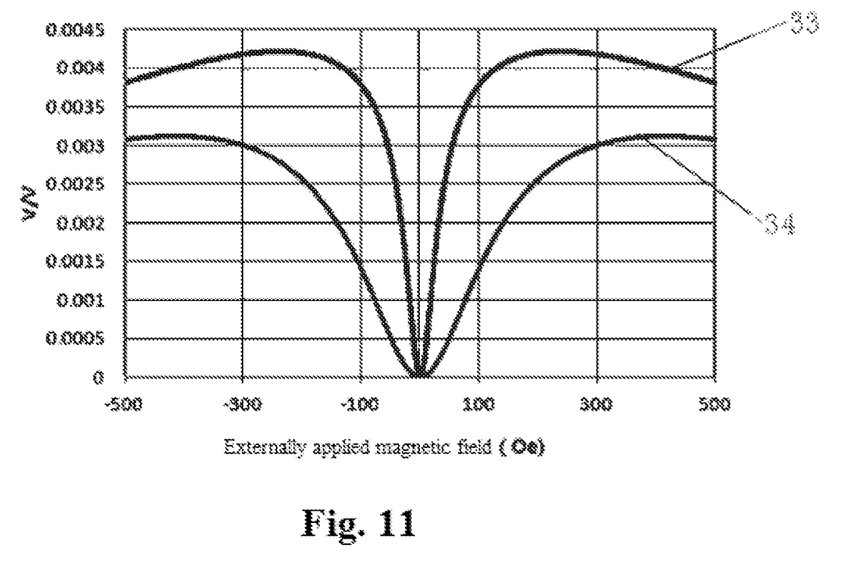
FIG. 11 is a transfer curve of a magnetic field sensor in a TMR three-layer film structure with and without an attenuator in the present invention.

FIG. 11 is a conversion characteristic curve of a single chip referenced bridge type sensor with magnetoresistive sense elements in a TMR three-layer film structure with and without an attenuator. Curve 33 represents a situation that the attenuator does not exist, and curve 34 represents a situation that the attenuator is used, a horizontal axis expresses a magnitude of an externally applied magnetic field, and a longitudinal axis expresses a ratio of sensor output voltage to power supply voltage. By comparing the two curves, it can be seen that the working range of the sensor obviously becomes wider after using the attenuator.

What is discussed above is the situation that the bridge is the full-bridge. Since the working principle of the half-bridge and the quasi-bridge is the same as that of the full-bridge, the working principles are not repetitively described here. The conclusions obtained above are also applicable to single chip referenced bridge type magnetic field sensors in half-bridge and quasi-bridge structures.

The embodiments described above are just preferred embodiments of the present invention and are not used for limiting the present invention. For one skilled in the art, the present invention can have various alterations and changes.

Any modification, equivalent replacement, improvement and the like made within the spirit and principle of the present invention shall also be included in the protection range of the present invention.

The invention claimed is:

1. A single chip referenced bridge type magnetic field sensor for a high-intensity magnetic field, the sensor comprising:
    a substrate;
    at least one reference arm deposited on the substrate, the reference arm comprising at least one row/column of reference element strings which comprise one or at least two identical electrically interconnected magnetoresistive sense elements;
    at least one sense arm deposited on the substrate, the sense arm comprising at least one row/column of sense element strings which comprise one or at least two identical electrically interconnected magnetoresistive sense elements; and
    at least one attenuator and at least two shielding structures, the attenuator and the shielding structures being mutually interleaved in a spaced manner, shapes of the attenuator and the shielding structures being the same, and width and area of the shielding structures being respectively greater than width and area of the attenuator;
    wherein the reference arm and the sense arm are connected to form a bridge;
    wherein a respective one of the at least two shielding structures is on top of each reference element string, and a respective one of the at least one attenuator is on top of each sense element string, the reference element strings are located below or above the shielding structures and the sense element strings are located below or above the attenuators;
    wherein the reference element strings and the sense element strings are the same in number of rows/columns and are mutually interleaved in a spaced manner along a longitudinal or transverse direction; and
    wherein a gain coefficient of a magnetic field at the position of the sense element strings is greater than a gain coefficient of a magnetic field at the position of the reference element strings.

2. The single chip referenced bridge type magnetic field sensor according to claim 1, wherein the magnetoresistive sense elements forming the reference element strings and the sense element strings include AMR, GMR or TMR sensor elements.

3. The single chip referenced bridge type magnetic field sensor according to claim 2, wherein the magnetoresistive sense elements are in a GMR spin valve structure, a GMR multilayer film structure, a TMR spin valve structure or a TMR three-layer film structure.

4. The single chip referenced bridge type magnetic field sensor according to claim 1, wherein the bridge is a half-bridge, a full-bridge or a quasi-bridge.

5. The single chip referenced bridge type magnetic field sensor according to claim 1, wherein the magnetoresistive sense elements on the sense arm and the magnetoresistive sense elements on the reference arm are the same in number.

6. The single chip referenced bridge type magnetic field sensor according to claim 1, wherein each sense element string and an adjacent reference element string are spaced apart at a spacing L, when the number of the attenuators is odd, two reference element strings are adjacent in the middle and have a spacing 2L therebetween, and when the number of the attenuators is even, two sense element strings are adjacent in the middle and have a spacing 2L therebetween.

7. The single chip referenced bridge type magnetic field sensor according to claim 1, wherein the number N of the attenuators is not smaller than the number of rows/columns of the sense element strings, the number M of the shielding structures is not smaller than the number of rows/columns of the reference element strings, and N<M, wherein N and M are positive integers.

8. The single chip referenced bridge type magnetic field sensor according to claim 1, wherein the substrate comprises an integrated circuit or is connected with other substrates comprising an integrated circuit.

9. The single chip referenced bridge type magnetic field sensor according to claim 8, wherein the integrated circuit is one of CMOS, BiCMOS, Bipolar, BCDMOS and SOI, and the reference arm and the sense arm are directly deposited on top of the integrated circuit of the substrate.

10. The single chip referenced bridge type magnetic field sensor according to claim 8, wherein the substrate is an ASIC chip, and the ASIC chip comprises any one or at least two of an offset circuit, a gain circuit, a calibration circuit, a temperature compensation circuit and a logic circuit.

11. The single chip referenced bridge type magnetic field sensor according to claim 10, wherein the logic circuit is a digital switching circuit or a rotation angle calculating circuit.

12. The single chip referenced bridge type magnetic field sensor according to claim 1, wherein the shapes of the shielding structures and the attenuators are arrays of long bars which extend along a transverse/longitudinal direction.

13. The single chip referenced bridge type magnetic field sensor according to claim 1, wherein the shielding structures and the attenuators are composed of an identical material which is soft ferromagnetic alloy, and the soft ferromagnetic alloy contains one or at least two elements of Ni, Fe and Co.

14. The single chip referenced bridge type magnetic field sensor according to claim 1, wherein an input/output connecting terminal of the single chip referenced bridge type magnetic field sensor is electrically connected to an input/output connecting terminal of a semiconductor package, and a method of the semiconductor package comprises pad wire bonding, flip chip, ball grid array package, wafer level package or chip-on-board package.

15. The single chip referenced bridge type magnetic field sensor according to claim 1, wherein a working magnetic field intensity of the single chip referenced bridge type magnetic field sensor is 20-500 gausses.

16. The single chip referenced bridge type magnetic field sensor according to claim 1, wherein the shielding structures fully cover the reference element strings.

* * * * *